(12) United States Patent
Li et al.

(10) Patent No.: US 10,210,791 B2
(45) Date of Patent: Feb. 19, 2019

(54) SHIFT REGISTER UNIT, DRIVING METHOD, GATE DRIVER ON ARRAY AND DISPLAY DEVICE

(71) Applicants: BOE Technology Group Co., Ltd., Beijing (CN); Beijing BOE Optoelectronics Technology Co., Ltd., Beijing (CN)

(72) Inventors: Yan Li, Beijing (CN); Lingyun Shi, Beijing (CN); Wei Sun, Beijing (CN); Xiaobo Xie, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 15/744,554

(22) PCT Filed: Jul. 13, 2017

(86) PCT No.: PCT/CN2017/092712
§ 371 (c)(1),
(2) Date: Jan. 12, 2018

(87) PCT Pub. No.: WO2018/059075
PCT Pub. Date: Apr. 5, 2018

(65) Prior Publication Data
US 2019/0005866 A1    Jan. 3, 2019

(30) Foreign Application Priority Data

Sep. 30, 2016    (CN) .......................... 2016 1 0875608

(51) Int. Cl.
*G11C 19/00*    (2006.01)
*G09G 3/20*    (2006.01)
(Continued)

(52) U.S. Cl.
CPC ........... *G09G 3/2092* (2013.01); *G11C 19/28* (2013.01); *G09G 3/3677* (2013.01);
(Continued)

(58) Field of Classification Search
None
See application file for complete search history.

(56) References Cited

U.S. PATENT DOCUMENTS

2011/0150169 A1    6/2011  Lin et al.
2014/0159999 A1*   6/2014  Gu ........................ G11C 19/28
                                                            345/100
(Continued)

FOREIGN PATENT DOCUMENTS

CN    103198781 A    7/2013
CN    103730089 A    4/2014
(Continued)

OTHER PUBLICATIONS

Oct. 17, 2017—International Search Report and Written Opinion Appn PCT/CN2017/092712 with Eng Tran.

*Primary Examiner* — Tuan T Lam
(74) *Attorney, Agent, or Firm* — Banner & Witcoff, Ltd.

(57) ABSTRACT

A shift register unit, a driving method, a gate driver on array and a display device. The shift register unit includes: a first clock control circuit, a second clock control circuit, an output control circuit and an output circuit. The first clock control circuit is configured to, under control of a second control signal from a second control signal terminal, a third clock signal from a third clock signal terminal, and a fourth clock signal from a fourth clock signal terminal, alternately output a second clock signal from a second clock signal terminal and a first clock signal from a first clock signal terminal to the output control circuit. The second clock control circuit is configured to alternately output the first clock signal and the second control signal to the output (Continued)

circuit under control of the second control signal, the third clock signal and the fourth clock signal.

20 Claims, 5 Drawing Sheets

(51) Int. Cl.
    *G11C 19/28*    (2006.01)
    *G09G 3/36*    (2006.01)

(52) U.S. Cl.
    CPC ............... *G09G 2310/0286* (2013.01); *G09G 2310/061* (2013.01); *G09G 2330/021* (2013.01)

(56) References Cited

U.S. PATENT DOCUMENTS

| | | | |
|---|---|---|---|
| 2015/0301415 A1 | 10/2015 | Sawada et al. | |
| 2016/0372063 A1* | 12/2016 | Li | G11C 19/28 |

FOREIGN PATENT DOCUMENTS

| | | |
|---|---|---|
| CN | 104269145 A | 1/2015 |
| CN | 106205461 A | 12/2016 |

* cited by examiner

ND DISPLAY DEVICE

The application is a U.S. National Phase Entry of International Application No. PCT/CN2017/092712 filed on Jul. 13, 2017, designating the United States of America and claiming priority to Chinese Patent Application No. 201610875608.8 filed on Sep. 30, 2016. The present application claims priority to and the benefit of the above-identified applications and the above-identified applications are incorporated by reference herein in their entirety.

TECHNICAL FIELD

Embodiments of the present disclosure relate to a shift register unit, a driving method, a gate driver on array and a display device.

BACKGROUND

When a display device displays an image, it needs to drive pixel units with a gate driver on array (GOA). The gate driver on array (also referred to as a shift register) comprises a plurality of cascaded shift register units, where each shift register unit is used for driving a row of pixel units, and the plurality of shift register units is used for implementing scan driving on the pixel units of the display device row by row, so as to display the image.

In existing technologies, the gate driver on array is capable of scanning respective rows of pixel units in the display device once within a time period of a frame, where a scanning time for each row of pixel units is determined by a frequency of a clock signal.

Since the frequency of the clock signal output by a clock signal terminal connected with the shift register unit is fixed, the scanning time for each row of pixel units is also fixed when the gate driver on array is used for driving the pixel units. A driving approach is relatively monotonous.

SUMMARY

In a first aspect, embodiments of the disclosure provide a shift register unit, comprising:

a first clock control circuit, a second clock control circuit, an output control circuit and an output circuit, where:

the first clock control circuit is respectively connected with a first control signal terminal, a second control signal terminal, a first power signal terminal, a second power signal terminal, a first clock signal terminal, a second clock signal terminal, a third clock signal terminal, a fourth clock signal terminal and the output control circuit; the first control signal terminal and the second control signal terminal are respectively configured to provide a first control signal and a second control signal; the first clock signal terminal, the second clock signal terminal, the third clock signal terminal and the fourth clock signal terminal are respectively configured to provide a first clock signal, a second clock signal, a third clock signal and a fourth clock signal terminal;

the second clock control circuit is respectively connected with the first control signal terminal, the second control signal terminal, the first power signal terminal, the second power signal terminal, the first clock signal terminal, the second clock signal terminal, the third clock signal terminal, the fourth clock signal terminal and the output circuit;

the output control circuit is respectively connected with the first clock control circuit, an input signal terminal, a reset signal terminal, the second power signal terminal, a third power signal terminal, a fourth power signal terminal, a pull-up node and an output terminal, and is configured to control potentials of the pull-up node and the output terminal;

the output circuit is respectively connected with the second clock control circuit, the pull-up node and the output terminal, and is configured to output a signal from the second clock control circuit to the output terminal under control of the pull-up node;

the first clock control circuit is configured to, under control of the second control signal from the second control signal terminal, the third clock signal from the third clock signal terminal, and the fourth clock signal from the fourth clock signal terminal, alternately output the second clock signal and the first clock signal to the output control circuit; and the second clock control circuit is configured to alternately output the first clock signal and the second control signal to the output circuit under control of the second control signal, the third clock signal and the fourth clock signal; and the first clock signal, the second clock signal, the third clock signal and the fourth clock signal have a same frequency and different phases.

In a second aspect, embodiments of the disclosure provide a driving method of a shift register unit, with the shift register unit comprising a first clock control circuit, a second clock control circuit, an output control circuit and an output circuit, the method comprising:

in a first driving mode, with a first control signal output by a first control signal terminal being at a first potential and a second control signal output by a second control signal terminal being at a second potential, outputting a second clock signal from a second clock signal terminal to the output control circuit by the first clock control circuit, and outputting a first clock signal from a first clock signal terminal to the output circuit by the second clock control circuit; and in a second driving mode, with the first control signal output by the first control signal terminal being at the second potential and the second control signal output by the second control signal terminal being at the first potential, outputting a third clock signal from a third clock signal terminal, outputting a fourth clock signal from a fourth clock signal terminal, alternately outputting the second clock signal and the first clock signal to the output control circuit by the first clock control circuit, and alternately outputting the first clock signal and the second clock signal to the output circuit by the second clock control circuit;

wherein the first clock signal, the second clock signal, the third clock signal and the fourth clock signal have a same frequency and different phases.

In a third aspect, embodiments of the disclosure further provide a gate driver on array, comprising: at least two cascaded shift register units, wherein each of the shift register units is the shift register unit described above in the first aspect.

In a fourth aspect, embodiments of the disclosure further provide a display device, comprising: the gate driver on array described above in the third aspect.

BRIEF DESCRIPTION OF THE DRAWINGS

In order to illustrate the technical solutions in the embodiments of the present disclosure more clearly, the drawings needed to be used in the description of the embodiments or the existing arts will be briefly described in the following; it is obvious that the drawings described below are only related to some embodiments of the present disclosure, for one ordinary skilled person in the art, other drawings can be obtained according to these drawings without making other inventive work.

DETAILED DESCRIPTION

Figure 1:
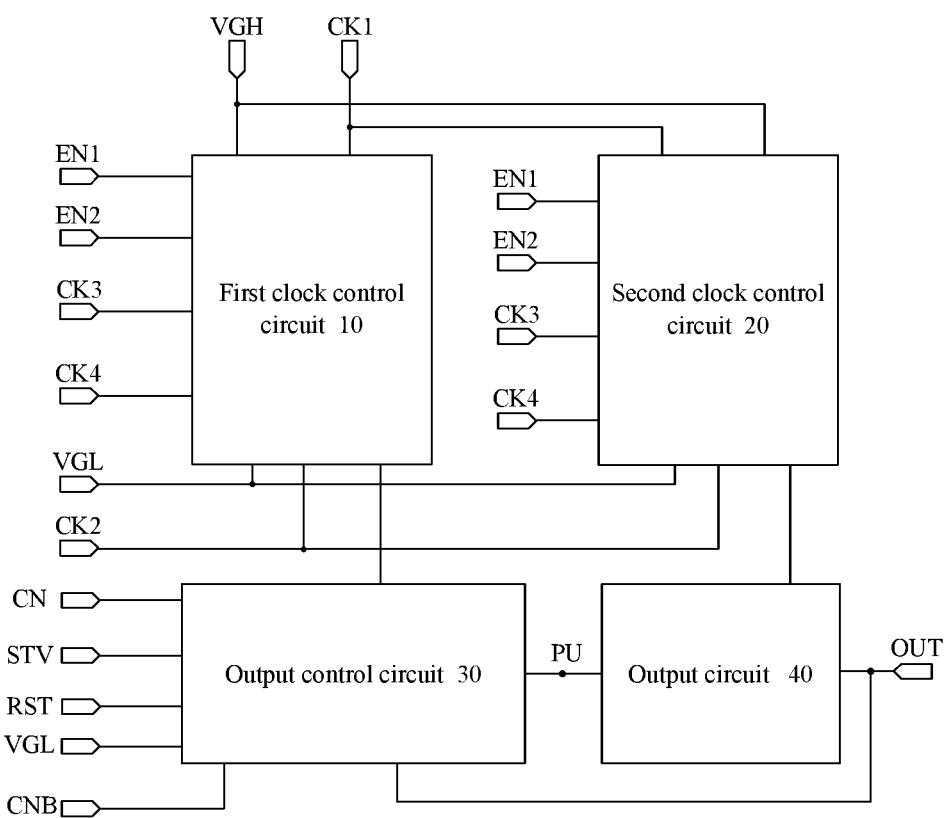
FIG. 1 is a first structural schematic diagram of a shift register unit provided by an embodiment of the present disclosure.

Hereafter, in order to illustrate the purposes, the technical solutions and advantages of the present disclosure more clearly, the embodiments of the present disclosure will be further described in details in connection with the drawings. It is obvious that the described embodiments are just a part but not all of the embodiments of the present disclosure. Based on embodiments of the present disclosure, all other embodiments obtained by those skilled in the art without making other inventive work should be within the scope of the present disclosure.

All transistors used in all embodiments of the present disclosure may be thin film transistors or field effect transistors, or other devices having same characteristics. According to functions in the circuit, the transistors used in the embodiments of the present disclosure are mainly switch transistors. Since a source electrode and a drain electrode of a switch transistor used herein are symmetrical, the source electrode and the drain electrode are interchangeable. In the embodiments of the present disclosure, the source electrode therein is referred to as a first electrode, the drain electrode is referred to as a second electrode, and a gate electrode is referred to as a third electrode. According to configuration in the drawings, it is stipulated that a middle terminal of the transistor is the gate electrode, a signal input terminal is the source electrode, and a signal output terminal is the drain electrode. In addition, a switch transistor used in the embodiments of the present disclosure includes any one of a P-type switch transistor and an N-type switch transistor. The P-type switch transistor is turned on when the gate electrode is at a low voltage level, and is turned off when the gate electrode is at a high voltage level; and the N-type switch transistor is turned on when the gate electrode is at the high voltage level, and is turned off when the gate electrode is at the low voltage level. In addition, a plurality of signals in respective embodiments of the present disclosure each corresponds to a first potential and a second potential. The first potential and the second potential only represent that the potential of the corresponding signal has two states, but does not represent that the first potential or the second potential throughout the text has a specific value. That is, potential values of the first potentials (or the second potentials) of respective signals may be the same or different. Further, frequencies of a first clock signal, a second clock signal, a third clock signal and a fourth clock signal in the embodiments of the present disclosure are the same and phases thereof are different from each other. For example, duty cycles of the first clock signal, the second clock signal, the third clock signal and the fourth clock signal may all be one half; and a phase difference between the first clock signal and the second clock signal is 180 degrees, a phase difference between the third clock signal and the fourth clock signal is 180 degrees, and a phase difference between the first clock signal and the third clock signal is 90 degrees.

Embodiments of the present disclosure provide a shift register unit, a driving method, a gate driver on array and a display device. The shift register unit comprises an output control circuit and an output circuit, and further comprises two clock control circuits. By the two clock control circuits, clock signals with different frequencies or different duty cycles may be respectively output to the output control circuit and the output circuit, so that the output circuit may output driving signals with different frequencies or different duty cycles to pixel units through the output terminal. Thus, a charging time of the shift register unit for each row of pixel units may be further adjusted, thereby enriching driving approaches performed by the gate driver on array on the display device, and improving driving flexibility.

FIG. 1 is a structural schematic diagram of a shift register unit provided by an embodiment of the present disclosure; as shown in FIG. 1, the shift register unit comprises: a first clock control circuit 10, a second clock control circuit 20, an output control circuit 30 and an output circuit 40.

The first clock control circuit 10 is respectively connected with a first control signal terminal EN1, a second control signal terminal EN2, a first power signal terminal VGH, a second power signal terminal VGL, a first clock signal terminal CK1, a second clock signal terminal CK2, a third clock signal terminal CK3, a fourth clock signal terminal CK4 and the output control circuit 30. The second clock control circuit 20 is respectively connected with the first control signal terminal EN1, the second control signal terminal EN2, the first power signal terminal VGH, the second power signal terminal VGL, the first clock signal terminal CK1, the second clock signal terminal CK2, the third clock signal terminal CK3, the fourth clock signal terminal CK4 and the output circuit 40.

The output control circuit 30 is respectively connected with the first clock control circuit 10, an input signal terminal STV, a reset signal terminal RST, the second power signal terminal VGL, a third power signal terminal CN, a fourth power signal terminal CNB, a pull-up node PU and the output terminal OUT, and is configured to control potentials of the pull-up node PU and an output terminal OUT; the output circuit 40 is respectively connected with the second clock control circuit 20, the pull-up node PU and the output terminal OUT, and is configured to output a signal from the second clock control circuit 20 to the output terminal OUT under control of the pull-up node PU.

The first clock control circuit 10 is configured to output a second clock signal from the second clock signal terminal CK2 to the output control circuit 30 under control of a first control signal from the first control signal terminal EN1. Correspondingly, the second clock control circuit 20 is configured to output a first clock signal from the first clock signal terminal CK1 to the output circuit 40 under control of the first control signal.

Alternatively, the first clock control circuit 10 is configured to alternately output the second clock signal and the first clock signal to the output control circuit 30 under control of the second control signal from the second control signal terminal EN2, a third clock signal from the third clock signal terminal CK3, and a fourth clock signal from the fourth clock signal terminal CK4. Correspondingly, the second clock control circuit 20 is configured to alternately output the first clock signal and the second control signal to the output circuit 40 under control of the second control signal, the third clock signal and the fourth clock signal.

For example, the first clock signal, the second clock signal, the third clock signal and the fourth clock signal have a same frequency and different phases.

Figure 2:
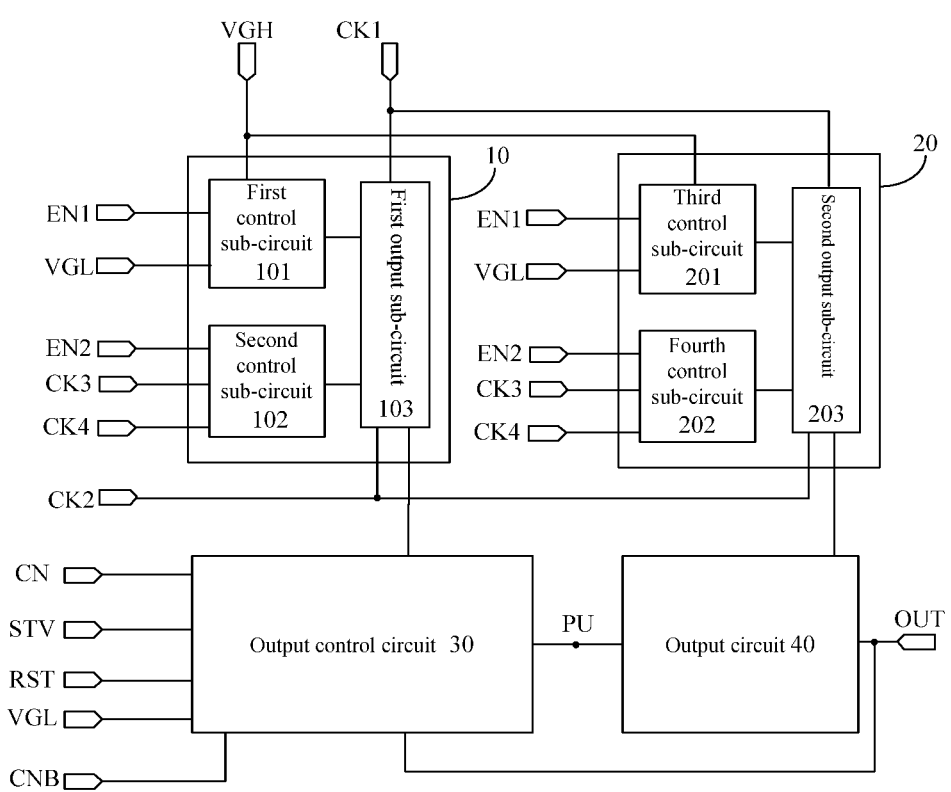
FIG. 2 is a second structural schematic diagram of a shift register unit provided by an embodiment of the present disclosure.

To sum up, an embodiment of the present disclosure provides a shift register unit, which comprises an output control circuit and an output circuit, and further comprises clock control circuits. Through the clock control circuits, a first clock signal may be output to the output circuit, or a first clock signal and a second clock signal may be alternately output to the output circuit, so that the output circuit may output driving signals with different frequencies or different duty cycles to the pixel units under control of the signals output by the clock control circuits. Thus, a charging time of the shift register unit for each row of pixel units may be further adjusted, thereby enriching driving approaches performed by the gate driver on array on the display device, and improving driving flexibility FIG. 2 is another structural schematic diagram of a shift register unit provided by an embodiment of the present disclosure. As shown in FIG. 2, the first clock control circuit 10 includes: a first control sub-circuit 101, a second control sub-circuit 102 and a first output sub-circuit 103.

The first control sub-circuit 101 is respectively connected with the first control signal terminal EN1, the first power signal terminal VGH, the second power signal terminal VGL and the first output sub-circuit 103, and is configured to output a first power signal from the first power signal terminal VGH and a second power signal from the second power signal terminal VGL to the first output sub-circuit 103 under control of the first control signal from the control signal terminal EN1.

The second control sub-circuit 102 is respectively connected with the second control signal terminal EN2, the third clock signal terminal CK3, the fourth clock signal terminal CK4 and the first output sub-circuit 103, and is configured to output the third clock signal from the third clock signal terminal CK3 and the fourth clock signal from the fourth clock signal terminal CK4 to the first output sub-circuit 103 under control of the second control signal from the control signal terminal EN2.

The first output sub-circuit 103 is respectively connected with the first control sub-circuit 101, the second control sub-circuit 102, the first clock signal terminal CK1, the second clock signal terminal CK2 and the output control circuit 30, and is configured to: output the second clock signal to the output control circuit 30 under control of the first power signal and the second power signal; or, alternately output the second clock signal and the first clock signal to the output control circuit 30, under control of the third clock signal and the fourth clock signal.

For example, as shown in FIG. 2, the second clock control circuit 20 may comprise: a third control sub-circuit 201, a fourth control sub-circuit 202 and a second output sub-circuit 203.

The third control sub-circuit 201 is respectively connected with the first control signal terminal EN1, the first power signal terminal VGH, the second power signal terminal VGL and the second output sub-circuit 203, and is configured to: under control of the first control signal, output the first power signal from the first power signal terminal VGH and the second power signal from the second power signal terminal VGL to the second output sub-circuit 203.

The fourth control sub-circuit 202 is respectively connected with the second control signal terminal EN2, the third clock signal terminal CK3, the fourth clock signal terminal CK4 and the second output sub-circuit 203, and is configured to: under control of the second control signal, output the third clock signal from the third clock signal terminal CK3 and the fourth clock signal from the fourth clock signal terminal CK4 to the second output sub-circuit 203.

The second output sub-circuit 203 is respectively connected with the third control sub-circuit 201, the fourth control sub-circuit 202, the first clock signal terminal CK1, the second clock signal terminal CK2 and the output circuit 40, and is configured to output the first clock signal to the output circuit 40 under control of the first power signal and the second power signal, or is configured to alternately output the first clock signal and the second clock signal to the output circuit 40 under control of the third clock signal and the fourth clock signal.

Figure 3:
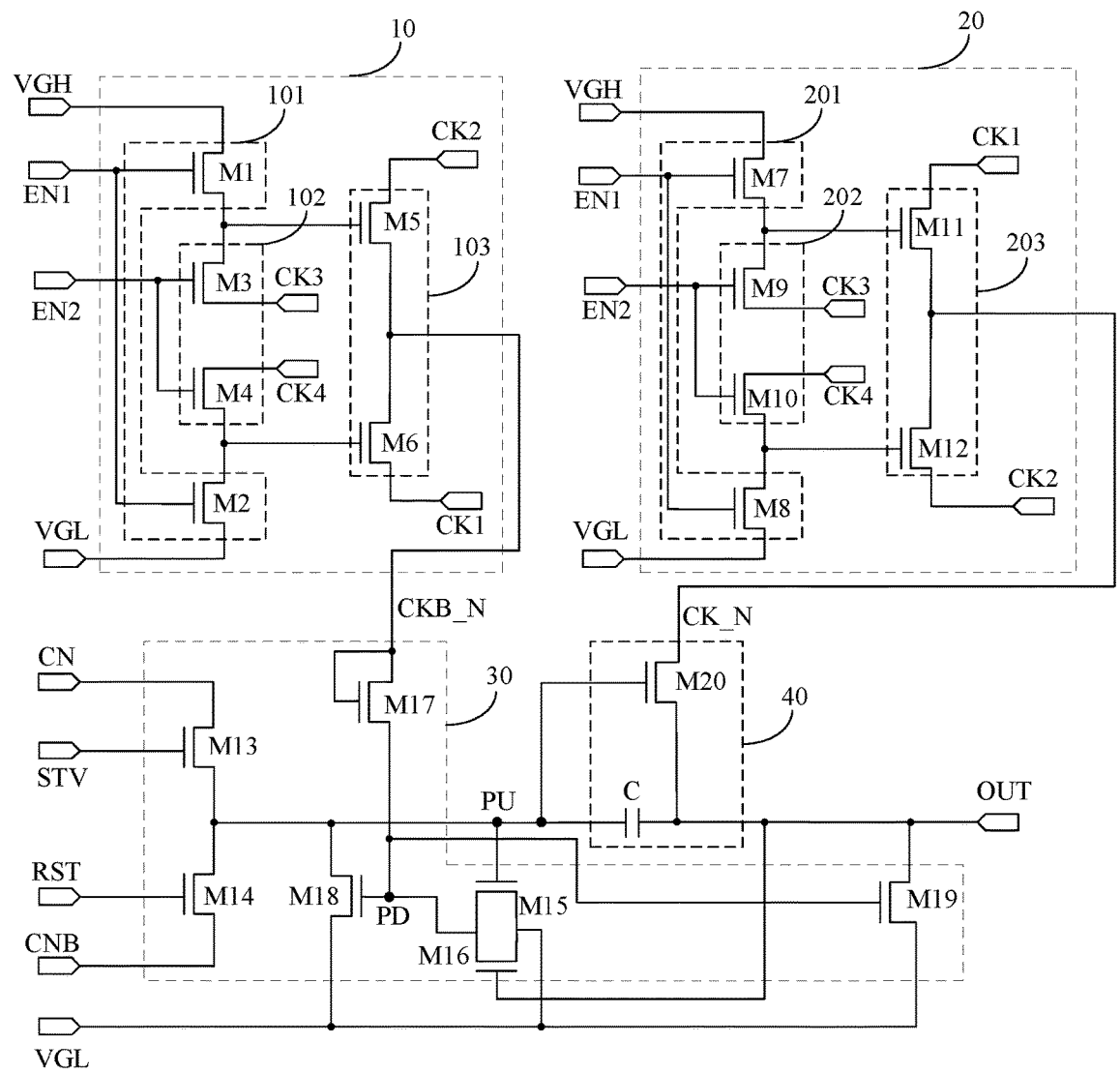
FIG. 3 is an exemplary circuit diagram of a shift register unit provided by an embodiment of the present disclosure.

FIG. 3 is a circuit structural schematic diagram of a shift register unit provided by an embodiment of the present disclosure. As shown in FIG. 3, the first control sub-circuit 101 includes a first transistor M1 and a second transistor M2; the second control sub-circuit 102 includes a third transistor M3 and a fourth transistor M4; and the first output sub-circuit 103 includes: a fifth transistor M5 and a sixth transistor M6.

A gate electrode of the first transistor M1 is connected with the first control signal terminal EN1, a first electrode of the first transistor M1 is connected with the first power signal terminal VGH, and a second electrode of the first transistor M1 is connected with a gate electrode of the fifth transistor M5.

A gate electrode of the second transistor M2 is connected with the first control signal terminal EN1, a first electrode of the second transistor M2 is connected with the second power signal terminal VGL, and a second electrode of the second transistor M2 is connected with a gate electrode of the sixth transistor M6.

A gate electrode of the third transistor M3 is connected with the second control signal terminal EN2, a first electrode of the third transistor M3 is connected with the third clock signal terminal CK3, a second electrode of the third transistor M3 is connected with the gate electrode of the fifth transistor M5.

A gate electrode of the fourth transistor M4 is connected with the second control signal terminal EN2, a first electrode of the fourth transistor M4 is connected with the fourth clock signal terminal CK4, and a second electrode of the fourth transistor M4 is connected with the gate electrode of the sixth transistor M6.

A first electrode of the fifth transistor M5 is connected with the second clock signal terminal CK2, and a second electrode of the fifth transistor M5 is connected with the output control circuit 30.

A first electrode of the sixth transistor M6 is connected with the first clock signal terminal CK1, and a second electrode of the sixth transistor M6 is connected with the output control circuit 30.

For example, with reference to FIG. 3, the third control sub-circuit 201 includes: a seventh transistor M7 and an eighth transistor M8; the fourth control sub-circuit 202 includes: a ninth transistor M9 and a tenth transistor M10; and the second output sub-circuit 203 includes: an eleventh transistor M11 and a twelfth transistor M12.

A gate electrode of the seventh transistor M7 is connected with the first control signal terminal EN1, a first electrode of the seventh transistor M7 is connected with the first power signal terminal VGH, and a second electrode of the seventh transistor M7 is connected with a gate electrode of the eleventh transistor M11.

A gate electrode of the eighth transistor M8 is connected with the first control signal terminal EN1, a first electrode of the eighth transistor M8 is connected with the second power signal terminal VGL, and a second electrode of the eighth transistor M8 is connected with a gate electrode of the twelfth transistor M12.

A gate electrode of the ninth transistor M9 is connected with the second control signal terminal EN2, a first electrode of the ninth transistor M9 is connected with the third clock signal terminal CK3, and a second electrode of the ninth transistor M9 is connected with the gate electrode of the eleventh transistor M11.

A gate electrode of the tenth transistor M10 is connected with the second control signal terminal EN2, a first electrode of the tenth transistor M10 is connected with the fourth clock signal terminal CK4, and a second electrode of the tenth transistor M10 is connected with the gate electrode of the twelfth transistor M12.

A first electrode of the eleventh transistor M11 is connected with the first clock signal terminal CK1, and a second electrode of the eleventh transistor M11 is connected with the output circuit 40.

A first electrode of the twelfth transistor M12 is connected with the second clock signal terminal CK2, and a second electrode of the twelfth transistor M12 is connected with the output circuit 40.

In an exemplary implementation of an embodiment of the present disclosure, duty cycles of the first clock signal, the second clock signal, the third clock signal and the fourth clock signal are all one half; and a phase difference between the first clock signal and the second clock signal is 180 degrees, a phase difference between the third clock signal and the fourth clock signal is 180 degrees, and a phase difference between the first clock signal and the third clock signal is 90 degrees.

As an exemplary implementation, with reference to FIG. 3, the output control circuit 30 may include: a first output control transistor M13, a second output control transistor M14, a third output control transistor M15, a fourth output control transistor M16, a fifth output control transistor M17, a sixth output control transistor M18 and a seventh output control transistor M19. The output circuit 40 includes: an output transistor M20 and a capacitor C.

For example, a gate electrode of the first output control transistor M13 is connected with the input signal terminal STV, a first electrode of the first output control transistor M13 is connected with the third power signal terminal CN, and a second electrode of the first output control transistor M13 is connected with the pull-up node PU.

A gate electrode of the second output control transistor M14 is connected with the reset signal terminal RST, a first electrode of the second output control transistor M14 is connected with the fourth power signal terminal CNB, and a second electrode of the second output control transistor M14 is connected with the pull-up node PU.

A gate electrode of the third output control transistor M15 is connected with the pull-up node PU, a first electrode of the third output control transistor M15 is connected with the second power signal terminal VGL, and a second electrode of the third output control transistor M15 is connected with a pull-down node PD.

A gate electrode of the fourth output control transistor M16 is connected with the output terminal OUT, a first electrode of the fourth output control transistor M16 is connected with the second power signal terminal VGL, and a second electrode of the fourth output control transistor M16 is connected with the pull-down node PD.

A gate electrode and a first electrode of the fifth output control transistor M17 are connected with the first clock control circuit 10, and a second electrode of the fifth output control transistor M17 is connected with the pull-down node PD. For example, the gate electrode and the first electrode of the fifth output control transistor M17 are both connected with the second electrode of the fifth transistor M5 and the second electrode of the sixth transistor M6 of the first clock control circuit 10.

A gate electrode of the sixth output control transistor M18 is connected with the pull-down node PD, a first electrode of the sixth output control transistor M18 is connected with the second power signal terminal VGL, and a second electrode of the sixth output control transistor M18 is connected with the pull-up node PU.

A gate electrode of the seventh output control transistor M19 is connected with the pull-down node PD, a first electrode of the seventh output control transistor M19 is connected with the second power signal terminal VGL, and a second electrode of the seventh output control transistor M19 is connected with the output terminal OUT.

A gate electrode of the output transistor M20 is connected with the pull-up node PU, a first electrode of the output transistor M20 is connected with the second clock control circuit 20, and a second electrode of the output transistor M20 is connected with the output terminal OUT. For example, the first electrode of the output transistor M20 is connected with the second electrode of the eleventh transistor M11 and the second electrode of the twelfth transistor M12 of the second clock control circuit 20. One terminal of the capacitor C is connected with the pull-up node PU, and another terminal of the capacitor C is connected with the output terminal OUT.

To sum up, an embodiment of the present disclosure provides a shift register unit, which comprises the output control circuit and the output circuit, and further comprises the first clock control circuit and the second clock control circuit. Through the two clock control circuits, clock signals with different frequencies or different duty cycles may be respectively output to the output control circuit and the output circuit, so that the output circuit may output driving signals with different frequencies or different duty cycles to the pixel units under control of the signal output by the second clock control circuit, and further a charging time of the shift register unit for each row of pixel units may be adjusted. When a frequency of the driving signal output by the output circuit is relatively high or a duty cycle of the driving signal is relatively small, the charging time for each row of pixel units is relatively short, and a display resolution of the display device is high at this case, thereby achieving high definition display of the display device; when the frequency of the driving signal output by the output circuit is relatively low or the duty cycle of the driving signal is relatively high, the charging time for each row of pixel units is relatively long, and resolution of the display device is low at this case, thereby achieving display of the display device with low power consumption. Thus, driving approaches performed by the gate driver on array on the display device is enriched, and driving flexibility is improved.

It should be noted that, in respective embodiments of the present disclosure, it is illustrated with a case where respective transistors are N-type transistors, and the first potential is a higher potential compared to the second potential. An N-type transistor may be an amorphous silicon thin film transistor, whose fabrication process is relatively stable, and cost is relatively low.

Of course, respective transistors may also be P-type transistors; when the respective transistors are P-type transistors, the first potential may be a lower potential compared to the second potential, and a potential change of a respective signal terminal may be opposite to that shown in FIG. 5 or FIG. 6 below (that is, a phase difference therebetween is 180 degrees).

Figure 4:
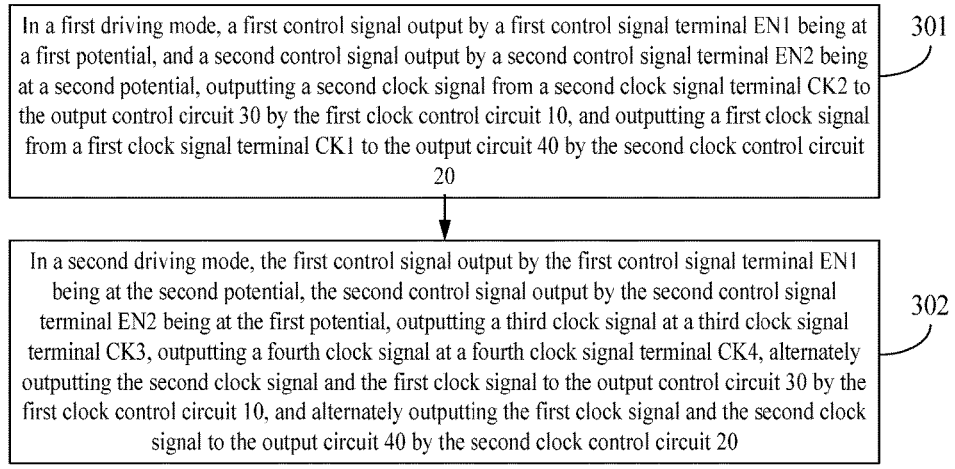
FIG. 4 is a flow chart of a driving method of a shift register unit provided by an embodiment of the present disclosure.

FIG. 4 is a flow chart of a driving method of a shift register unit provided by an embodiment of the present disclosure, and the method may be used in the shift register unit as shown in any one of FIG. 1 to FIG. 3. With reference to FIG. 1, the shift register unit may comprise: a first clock control circuit 10, a second clock control circuit 20, an output control circuit 30 and an output circuit 40. With reference to FIG. 4, the method may comprise:

Step 301: in a first driving mode, a first control signal output by a first control signal terminal EN1 being at a first potential, and a second control signal output by a second control signal terminal EN2 being at a second potential, outputting a second clock signal from a second clock signal terminal CK2 to the output control circuit 30 by the first clock control circuit 10, and outputting a first clock signal from a first clock signal terminal CK1 to the output circuit 40 by the second clock control circuit 20.

Step 302: in a second driving mode, the first control signal output by the first control signal terminal EN1 being at the second potential, the second control signal output by the second control signal terminal EN2 being at the first potential, outputting a third clock signal at a third clock signal terminal CK3, outputting a fourth clock signal at a fourth clock signal terminal CK4, alternately outputting the second clock signal and the first clock signal to the output control circuit 30 by the first clock control circuit 10, and alternately outputting the first clock signal and the second clock signal to the output circuit 40 by the second clock control circuit 20.

For example, the first clock signal, the second clock signal, the third clock signal and the fourth clock signal have a same frequency and different phases. In addition, the second potential may be a low potential relative to the first potential.

To sum up, an embodiment of the present disclosure provided a driving method of the shift register unit; the driving method comprises two driving modes; frequencies of signals output by the second clock control circuit to the output circuit in different driving modes are different, so that the output circuit may output driving signals with different frequencies or different duty cycles to the pixel units, thereby adjusting a charging time of the shift register unit for each row of pixel units. Thus, driving approaches performed by the gate driver on array on the display device are enriched, and driving flexibility is improved.

For example, with reference to FIG. 2, the first clock control circuit 10 includes: a first control sub-circuit 101, a second control sub-circuit 102 and a first output sub-circuit 103.

In the first driving mode, the first control signal is at the first potential, the first control sub-circuit 101 outputs a first power signal from a first power signal terminal VGH and a second power signal from a second power signal terminal VGL to the first output sub-circuit 103, and under control of the first power signal and the second power signal, the first output sub-circuit 103 outputs the second clock signal to the output control circuit 30.

In the second driving mode, the second control signal is at the first potential, and the second control sub-circuit 102 outputs the third clock signal and the fourth clock signal to the first output sub-circuit 103. When the third clock signal is at the first potential, the first output sub-circuit 103 outputs the second clock signal to the output control circuit 30; and when the fourth clock signal is at the first potential, the first output sub-circuit 103 outputs the first clock signal to the output control circuit 30.

For example, with reference to FIG. 2, the second clock control circuit 20 includes: a third control sub-circuit 201, a fourth control sub-circuit 202 and a second output sub-circuit 203.

In the first driving mode, the first control signal is at the first potential, the third control sub-circuit 201 outputs the first power signal from the first power signal terminal VGH and the second power signal from the second power signal terminal VGL to the second output sub-circuit 203, and under control of the first power signal and the second power signal, the second output sub-circuit 203 outputs the first clock signal to the output circuit 40.

In the second driving mode, the second control signal is at the first potential, and the fourth control sub-circuit 202 outputs the third clock signal and the fourth clock signal to the second output sub-circuit 203. When the third clock signal is at the first potential, the second output sub-circuit 203 outputs the first clock signal to the output circuit 40; and when the fourth clock signal is at the first potential, the second output sub-circuit 203 outputs the second clock signal to the output circuit 40.

Further, as shown in FIG. 3, the first control sub-circuit in the first clock control circuit 10 includes: a first transistor M1 and a second transistor M2; the second control sub-circuit 102 includes: a third transistor M3 and a fourth transistor M4; the first output sub-circuit 103 includes: a fifth transistor M5 and a sixth transistor M6.

Figure 5:
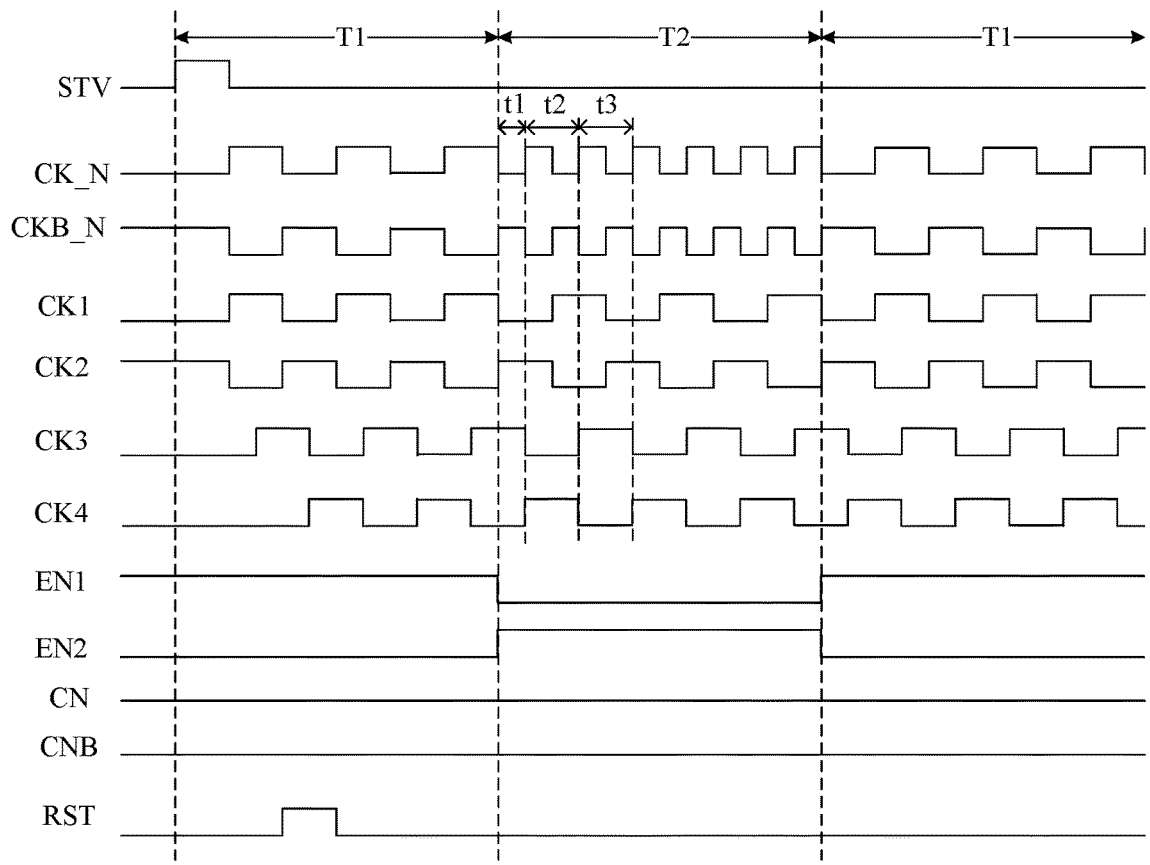
FIG. 5 is a first timing diagram of respective signals in a shift register unit provided by an embodiment of the present disclosure.
Figure 6:
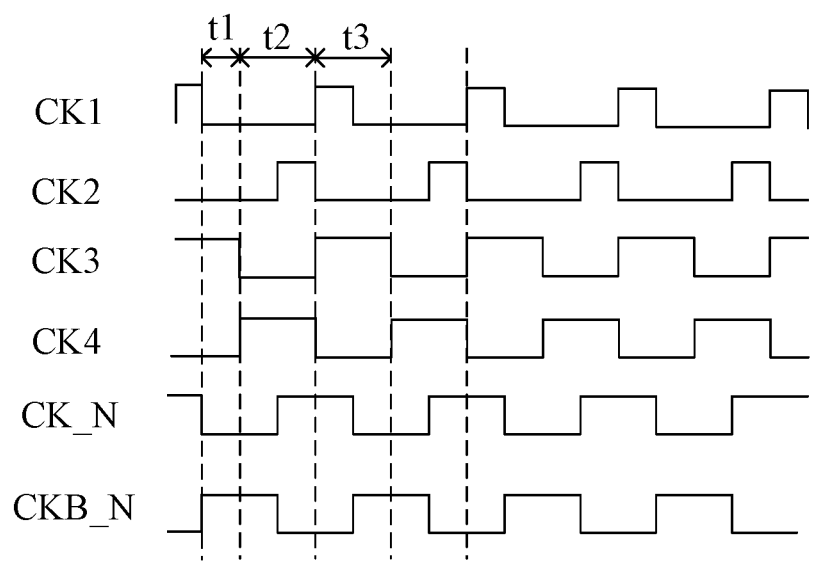
FIG. 6 is a second timing diagram of respective signals in a shift register unit provided by an embodiment of the present disclosure.

FIG. 5 is a timing diagram of a driving method provided by an embodiment of the present disclosure, a signal CK_N in FIG. 5 is a signal output by the second clock control circuit 20 to the output circuit 40, and a signal CKB_N is a signal output by the first clock control circuit 10 to the output control circuit 30. As it can be seen from FIG. 5, in the first driving mode T1, the first control signal output by the first control signal terminal EN1 is at the first potential, and the first transistor M1 and the second transistor M2 are turned on; the first power signal terminal VGH outputs the first power signal to the gate electrode of the fifth transistor M5, the first power signal is at the first potential, and the fifth transistor M5 is turned on at this time; the second clock signal terminal CK2 outputs the second clock signal to the output control circuit 30 via the fifth transistor M5; the second power signal terminal VGL outputs the second power signal to the gate electrode of the sixth transistor M6 via the second transistor M2, the second power signal is at the second potential, and the sixth transistor M6 is turned off. With reference to FIG. 5, it can be known that, in the first driving mode T1, a waveform of the signal CKB_N output by the first clock control circuit 10 to the output control circuit 30 is the same as a waveform of the second clock signal.

With reference to FIG. 5, in the second driving mode T2, the second control signal output by the second control signal terminal EN2 is at the first potential, and at this time, the third transistor M3 and the fourth transistor M4 are turned on; the third clock signal terminal CK3 outputs the third clock signal to the gate electrode of the fifth transistor M5 via the third transistor M3, and the fourth clock signal terminal CK4 outputs the fourth clock signal to the gate electrode of the sixth transistor M6 via the fourth transistor M4. When the third clock signal is at the first potential, the fifth transistor M5 is turned on, and the second clock signal terminal CK2 outputs the second clock signal to the output control circuit 30. For example, as shown in FIG. 5, during stages t1 and t3 in the second driving mode T2, the third clock signal output by the third clock signal terminal CK3 is at the first potential, and at this time, the waveform of the signal CKB_N output by the first clock control circuit is the same as the waveform of the second clock signal.

When the fourth clock signal is at the first potential, the sixth transistor M6 is turned on, and the first clock signal terminal CK1 outputs the first clock signal to the output control circuit 30. For example, with reference to FIG. 5, in stage t2 of the second driving mode T2, when the fourth clock signal output by the fourth clock signal terminal CK4 is at the first potential, the third clock signal is at the second potential, and at this time, the waveform of the signal CKB_N output by the first clock control circuit 10 to the output control circuit 30 is the same as a waveform of the first clock signal. As it can be seen from FIG. 5, since the third clock signal and the fourth clock signal have a same frequency and inverse phases, the fifth transistor M5 and the sixth transistor M6 may be alternately turned on, so that the first clock control circuit 10 may alternately output the second clock signal and the first clock signal to the output control circuit 30.

Further, as shown in FIG. 3, the third control sub-circuit 201 in the second clock control circuit 20 includes: a seventh transistor M7 and an eighth transistor M8; the fourth control sub-circuit 202 includes: a ninth transistor M9 and a tenth transistor M10; and the second output sub-circuit 203 includes: an eleventh transistor M11 and a twelfth transistor M12.

With reference to FIG. 5, in the first driving mode T1, the first control signal is at the first potential, the seventh transistor M7 and the eighth transistor M8 are turned on, the first power signal terminal VGH outputs the first power signal to the gate electrode of the eleventh transistor M11, the first power signal is at the first potential, and at this time, the eleventh transistor M11 is turned on, and the first clock signal terminal CK1 outputs the first clock signal to the output circuit 40 via the eleventh transistor M11. The second power signal terminal VGL outputs the second power signal to the gate electrode of the twelfth transistor M12 via the eighth transistor M8, and the second power signal is at the second potential, so that the twelfth transistor M12 is turned off. With reference to FIG. 5, it can be known that, in the first driving mode T1, the waveform of the signal CK_N output by the second clock control circuit 20 to the output circuit 40 is the same as the waveform of the first clock signal.

In the second driving mode T2, the second control signal is at the first potential, the ninth transistor M9 and the tenth transistor M10 are turned on, the third clock signal terminal CK3 outputs the third clock signal to the gate electrode of the eleventh transistor M11 via the ninth transistor M9, and the fourth clock signal terminal CK4 outputs the fourth clock signal to the gate electrode of the twelfth transistor M12 via the tenth transistor M10. When the third clock signal is at the first potential, the eleventh transistor M11 is turned on, and the first clock signal terminal CK1 outputs the first clock signal to the output circuit 40. For example, as shown in FIG. 5, during stages t1 and t3 in the second driving mode T2, the third clock signal output by the third clock signal terminal CK3 is at the first potential, and at this time, the waveform of the signal CK_N output by the second clock control circuit 20 to the output circuit 40 is the same as the waveform of the first clock signal.

When the fourth clock signal is at the first potential, the twelfth transistor M12 is turned on, and the second clock signal terminal CK2 outputs the second clock signal to the output circuit 40. For example, with reference to FIG. 5, during stage t2 in the second driving mode T2, when the fourth clock signal output by the fourth clock signal terminal CK4 is at the first potential, the third clock signal is at the second potential, and at this time, the waveform of the signal CK_N output by the second clock control circuit 20 to the output circuit 40 is the same as the waveform of the second clock signal. As it can also be seen from FIG. 5, since the third clock signal and the fourth clock signal have of a same frequency and inverse phases, the eleventh transistor M11 and the twelfth transistor M12 may be alternately turned on, so that the second clock control circuit 20 may alternately output the first clock signal and the second clock signal to the output circuit 40.

To sum up, it can be known that, in an embodiment of the present disclosure, the frequency of the signal CK_N output by the second clock control circuit to the output circuit may be adjusted by adjusting the potential of the control signal output by the control signal terminal EN2. With reference to FIG. 5, when the control signal of the control signal terminal EN2 is at the second potential (for example, respective transistors are all N-type transistors and the second potential is a low potential), the shift register unit is in the first driving mode T1, and in the first driving mode, the frequency of the signal CK_N is equal to the frequency of the first clock signal. As it can be seen from FIG. 5, the frequency of the signal CK_N in the first driving mode is half of that in the second driving mode; at this time, a charging time of the shift register unit for each row of pixel units is relatively long, and a time period for the gate driver on array to scan respective rows of pixel units in the display device once is twice of that of the second driving mode; and at this time, display resolution of the display device is relatively low, which may implement display of the display device with low power consumption.

When the control signal output by the control signal terminal EN2 is at the first potential (for example, respective transistors are all N-type transistors, and the first potential is a high potential), the shift register unit is in the second driving mode T2, and the frequency of the signal CK_N is twice of that in the first driving mode T1; since a driving signal outputted is the signal CK_N when the shift register unit drives the pixel units, in the second driving mode T2 a charging time of the shift register unit for each row of pixel units is relatively short, and a time period for the gate driver on array to scan respective rows of pixel units in the display device once is half of that of the first driving mode. That is, within a time period for the gate driver on array to scan respective pixel units in the display device once by using the first driving mode, the gate driver on array can scan respective rows of pixel units in the display device twice by using the second driving mode. Thus, high-definition display of the display device can be achieved.

In an exemplary embodiment of the present disclosure, with reference to FIG. 5, the duty cycles of the first clock signal, the second clock signal, the third clock signal and the fourth clock signal may all be one half; in addition, a phase difference between the first clock signal and the second clock signal is 180 degrees, a phase difference between the third clock signal and the fourth clock signal is 180 degrees, and a phase difference between the first clock signal and the third clock signal is 90 degrees.

It should be noted that, duty cycles of the first clock signal to the fourth clock signal and a phase difference between respective clock signals may also be adjusted according to actual conditions, which will not be limited in the embodiments of the present disclosure. For example, the timing diagrams of the first lock signal to the fourth clock signal, the signal CK_N and the signal CKB_N may also be as shown in FIG. 6 (only timing of respective signals in the second driving mode T2 is plotted in FIG. 6), where the duty cycle of the first clock signal output by the first clock signal terminal CK1 may be one quarter, the duty cycle of the second clock signal output by the second clock signal terminal CK2 is also one quarter, the duty cycles of the clock signals output by the third clock signal terminal CK3 and the fourth clock signal terminal CK4 are both one half, and the third clock signal and the fourth clock signal have equal amplitudes and inverse phases. With respect to the frequencies and duty cycles of the respective clock signals shown in FIG. 6, in the first driving mode and the second driving mode, the frequency of the signal CK_N does not change, but the duty cycle of the signal CK_N is one quarter in the first driving mode and one half in the second driving mode. In a case where the frequencies are equal, the higher the duty cycle of the signal CK_N is, the longer the charging time for each row of pixel units is, so that adjustment of the charging time for each row of pixel units may also be implemented by changing the duty cycle of the driving signal of the shift register unit.

Further, by using the shift register unit shown in FIG. 3 and the timing diagram shown in FIG. 5 as an example, a working principle of the shift register unit in any driving mode is described. A specific driving process of the shift register unit in any driving mode may include an input stage, an output stage, and a reset stage. For example, the any driving mode may be the above-described first driving mode or the above-described second driving mode.

In the input stage, the input signal output from the input signal terminal STV is at the first potential, the first output control transistor M13 is turned on, and the third power signal terminal CN outputs the third power signal to the pull-up node PU; with reference to FIG. 5, the third power signal is at the first potential, so that the potential of the pull-up node PU is pulled up; at this time, the third output control transistor M15 and the output transistor M20 are turned on, the second power signal terminal VGL outputs the second power signal to the pull-down node PD, and the sixth output control transistor M18 is turned off. At this time, the output circuit 40 outputs the signal CK_N from the second clock control circuit 20 to the output terminal OUT; and in the input stage, the signal CK_N may be at the second potential.

In the output stage, the pull-up node maintains the first potential; when the signal CK_N output from the second clock control circuit 20 to the output circuit 40 transits to the first potential, the potential of the pull-up node PU is further pulled up due to a bootstrap effect, and at this time, the output transistor M20 is fully turned on, and the output circuit 40 outputs the signal CK_N from the second clock control circuit to the output terminal OUT, so as to implement turning on a row of pixel units (i.e., driving the row of pixel units), so that a source driver in the display device may charge the row of pixel units through data lines, and the charging time is just a time duration when the signal CK_N is at the first potential. With reference to FIG. 5, it can be known that, in the first driving mode T1 a time duration of the signal CK_N at the first potential in each cycle is relatively long, and in the second driving mode T2 a time duration of the signal CK_N at the first potential in each cycle is relatively short. Thus, in different driving modes, charging times of the shift register unit for each row of pixel units are different, thereby achieving high-definition display or display of the display device with low power consumption.

In the reset stage, the reset signal output by the reset signal terminal RST is also at the first potential, so that the second output control transistor M14 is turned on, the fourth power signal terminal CNB outputs the fourth power signal to the pull-up node PU, and the fourth power signal is at the second potential, so as to pull down the potential of the pull-up node PU to the second potential; and when the signal CK_N output from the second clock control circuit 20 to the output circuit 40 transits to the second potential again, and the signal CKB_N output by the first clock control circuit 10 to the output control circuit 30 is at the first potential, the fifth output control transistor M17 is turned on, the potential of the pull-down node PD is pulled up, the sixth output control transistor M18 and the seventh output control transistor M19 are turned on, the second power signal terminal VGL outputs the second power signal to the pull-up node PU and the output terminal OUT respectively, the second power signal is at the second potential, and at this time, the shift register unit is in a turned-off state, to avoid impact of abnormal output of the shift register unit on other rows of shift register units.

To sum up, an embodiment of the present disclosure provides a driving method of the shift register unit; the driving method comprises two driving modes; in different driving modes, the shift register unit may output driving signals with different frequencies or different duty cycles to the pixel units, and may further adjust a charging time of the shift register unit for each row of pixel units. In the first driving mode, when the frequency of the driving signal output by the shift register unit is relatively low, the charging time for each row of pixel units is relatively long, and at this time, the resolution of the display device is relatively low, so that display of the display device with low power consumption may be implemented; and in the second driving mode, when the frequency of the driving signal output by the shift register unit is relatively high, the charging time for each row of pixel units is relatively short, and at this time, the display resolution of the display device is relatively high, so that high-definition display of the display device may be implemented. Thus, driving approaches performed by the gate driver on array on the display device are enriched, and driving flexibility is improved.

An embodiment of the present disclosure provides a gate driver on array, and the gate driver on array may comprise at least two cascaded shift register units, where each shift register unit may be any one of the shift register units as shown in FIG. 1 to FIG. 3.

An embodiment of the present disclosure provides a display device, the display device may comprise a gate driver on array, and the gate driver on array may comprise at least two cascaded shift register units as shown by any one of FIG. 1 to FIG. 3. The display device may be: a liquid crystal display panel, electronic paper, an OLED panel, an AMOLED panel, a mobile phone, a tablet personal computer, a TV set, a display, a laptop, a digital photo frame, a navigator or any product or part with a display function.

Above is merely exemplary embodiments of the present disclosure rather than limitative of the present disclosure, and any modification, equivalent substitution and improvement within the spirit and principle of the present disclosure should fall into the protection scope of the present disclosure.

In the present disclosure, terms such as "first", "second" and the like used in the present disclosure do not indicate any sequence, quantity or significance but only for distinguishing different constituent parts. Also, the terms such as "a," "an," or "the" etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects.

What are described above is related to the illustrative embodiments of the disclosure only and not limitative to the scope of the disclosure; any changes or replacements easily for those technical personnel who are familiar with this technology in the field to envisage in the scopes of the disclosure, should be in the scope of protection of the present disclosure. Therefore, the scopes of the disclosure are defined by the accompanying claims.

The present application claims the priority of the Chinese Patent Application No. 201610875608.8 filed on Sep. 30, 2016, which is incorporated herein by reference in its entirety as part of the disclosure of the present application.

The invention claimed is:

1. A shift register unit, comprising:
a first clock control circuit, a second clock control circuit, an output control circuit and an output circuit, wherein:
the first clock control circuit is respectively coupled to a first control signal terminal, a second control signal terminal, a first power signal terminal, a second power signal terminal, a first clock signal terminal, a second clock signal terminal, a third clock signal terminal, a fourth clock signal terminal and the output control circuit; the first control signal terminal and the second control signal terminal are respectively configured to provide a first control signal and a second control signal; the first clock signal terminal, the second clock signal terminal, the third clock signal terminal and the fourth clock signal terminal are respectively configured to provide a first clock signal, a second clock signal, a third clock signal and a fourth clock signal terminal;
the second clock control circuit is respectively coupled to the first control signal terminal, the second control signal terminal, the first power signal terminal, the second power signal terminal, the first clock signal terminal, the second clock signal terminal, the third clock signal terminal, the fourth clock signal terminal and the output circuit;
the output control circuit is respectively coupled to the first clock control circuit, an input signal terminal, a reset signal terminal, the second power signal terminal, a third power signal terminal, a fourth power signal terminal, a pull-up node and an output terminal, and is configured to control potentials of the pull-up node and the output terminal;
the output circuit is respectively coupled to the second clock control circuit, the pull-up node and the output terminal, and is configured to output a signal from the second clock control circuit to the output terminal under control of the pull-up node;
the first clock control circuit is configured to, under control of the second control signal from the second control signal terminal, the third clock signal from the third clock signal terminal, and the fourth clock signal from the fourth clock signal terminal, alternately output the second clock signal and the first clock signal to the output control circuit; and the second clock control circuit is configured to alternately output the first clock signal and the second control signal to the output circuit under control of the second control signal, the third clock signal and the fourth clock signal; and
the first clock signal, the second clock signal, the third clock signal and the fourth clock signal have a same frequency and different phases.

2. The shift register unit according to claim 1, wherein:
the first clock control circuit is further configured to output the second clock signal from the second clock signal terminal to the output control circuit under control of the first control signal from the first control signal terminal; and
the second clock control circuit is configured to output the first clock signal from the first clock signal terminal to the output circuit under control of the first control signal.

3. The shift register unit according to claim 1, wherein the first clock control circuit includes: a first control sub-circuit, a second control sub-circuit and a first output sub-circuit;
the first control sub-circuit is respectively coupled to the first control signal terminal, the first power signal terminal, the second power signal terminal and the first output sub-circuit, and is configured to output a first power signal from the first power signal terminal and a second power signal from the second power signal terminal to the first output sub-circuit under control of the first control signal;
the second control sub-circuit is respectively coupled to the second control signal terminal, the third clock signal terminal, the fourth clock signal terminal and the first output sub-circuit, and is configured to output the third clock signal and the fourth clock signal to the first output sub-circuit under control of the second control signal; and
the first output sub-circuit is respectively coupled to the first control sub-circuit, the second control sub-circuit, the first clock signal terminal, the second clock signal terminal and the output control circuit, and is configured to output the second clock signal to the output control circuit under control of the first power signal and the second power signal; or, the first output sub-circuit is configured to alternately output the second clock signal and the first clock signal to the output control circuit under control of the third clock signal and the fourth clock signal.

4. The shift register unit according to claim 1, wherein the second clock control circuit includes: a third control sub-circuit, a fourth control sub-circuit and a second output sub-circuit;
the third control sub-circuit is respectively coupled to the first control signal terminal, the first power signal terminal, the second power signal terminal and the second output sub-circuit, and is configured to output a first power signal from the first power signal terminal and a second power signal from the second power signal terminal to the second output sub-circuit under control of the first control signal;
the fourth control sub-circuit is respectively coupled to the second control signal terminal, the third clock signal terminal, the fourth clock signal terminal and the second output sub-circuit, and is configured to output the third clock signal and the fourth clock signal to the second output sub-circuit under control of the second control signal; and the second output sub-circuit is respectively coupled to the third control sub-circuit, the fourth control sub-circuit, the first clock signal terminal, the second clock signal terminal and the output circuit, and is configured to output the first clock signal to the output circuit under control of the first power signal and the second power signal; or, the second output sub-circuit is configured to alternately output the first clock signal and the second clock signal to the output circuit under control of the third clock signal and the fourth clock signal.

5. The shift register unit according to claim 3, wherein the first control sub-circuit includes a first transistor and a second transistor; the second control sub-circuit includes a third transistor and a fourth transistor; and the first output sub-circuit includes a fifth transistor and a sixth transistor;

a gate electrode of the first transistor is coupled to the first control signal terminal, a first electrode of the first transistor is coupled to the first power signal terminal, and a second electrode of the first transistor is coupled to a gate electrode of the fifth transistor;

a gate electrode of the second transistor is coupled to the first control signal terminal, a first electrode of the second transistor is coupled to the second power signal terminal, and a second electrode of the second transistor is coupled to a gate electrode of the sixth transistor;

a gate electrode of the third transistor is coupled to the second control signal terminal, a first electrode of the third transistor is coupled to the third clock signal terminal, and a second electrode of the third transistor is coupled to the gate electrode of the fifth transistor;

a gate electrode of the fourth transistor is coupled to the second control signal terminal, a first electrode of the fourth transistor is coupled to the fourth clock signal terminal, and a second electrode of the fourth transistor is coupled to the gate electrode of the sixth transistor;

a first electrode of the fifth transistor is coupled to the second clock signal terminal, and a second electrode of the fifth transistor is coupled to the output control circuit;

a first electrode of the sixth transistor is coupled to the first clock signal terminal, and a second electrode of the sixth transistor is coupled to the output control circuit.

6. The shift register unit according to claim 4, wherein the third control sub-circuit includes a seventh transistor and an eighth transistor; the fourth control sub-circuit includes a ninth transistor and a tenth transistor; and the second output sub-circuit includes an eleventh transistor and a twelfth transistor;

a gate electrode of the seventh transistor is coupled to the first control signal terminal, a first electrode of the seventh transistor is coupled to the first power signal terminal, and a second electrode of the seventh transistor is coupled to a gate electrode of the eleventh transistor;

a gate electrode of the eighth transistor is coupled to the first control signal terminal, a first electrode of the eighth transistor is coupled to the second power signal terminal, and a second electrode of the eighth transistor is coupled to a gate electrode of the twelfth transistor;

a gate electrode of the ninth transistor is coupled to the second control signal terminal, a first electrode of the ninth transistor is coupled to the third clock signal terminal, and a second electrode of the ninth transistor is coupled to the gate electrode of the eleventh transistor;

a gate electrode of the tenth transistor is coupled to the second control signal terminal, a first electrode of the tenth transistor is coupled to the fourth clock signal terminal, and a second electrode of the tenth transistor is coupled to the gate electrode of the twelfth transistor;

a first electrode of the eleventh transistor is coupled to the first clock signal terminal, and a second electrode of the eleventh transistor is coupled to the output circuit; and a first electrode of the twelfth transistor is coupled to the second clock signal terminal, and a second electrode of the twelfth transistor is coupled to the output circuit.

7. The shift register unit according to claim 1, wherein the output control circuit includes a first output control transistor, a second output control transistor, a third output control transistor, a fourth output control transistor, a fifth output control transistor, a sixth output control transistor and a seventh output control transistor;

a gate electrode of the first output control transistor is coupled to the input signal terminal, a first electrode of the first output control transistor is coupled to the third power signal terminal, and a second electrode of the first output control transistor is coupled to the pull-up node;

a gate electrode of the second output control transistor is coupled to the reset signal terminal, a first electrode of the second output control transistor is coupled to the fourth power signal terminal, and a second electrode of the second output control transistor is coupled to the pull-up node;

a gate electrode of the third output control transistor is coupled to the pull-up node, a first electrode of the third output control transistor is coupled to the second power signal terminal, and a second electrode of the third output control transistor is coupled to a pull-down node;

a gate electrode of the fourth output control transistor is coupled to the output terminal, a first electrode of the fourth output control transistor is coupled to the second power signal terminal, and a second electrode of the fourth output control transistor is coupled to the pull-down node;

a gate electrode and a first electrode of the fifth output control transistor are coupled to the first clock control circuit, and a second electrode of the fifth output control transistor is coupled to the pull-down node;

a gate electrode of the sixth output control transistor is coupled to the pull-down node, a first electrode of the sixth output control transistor is coupled to the second power signal terminal, and a second electrode of the sixth output control transistor is coupled to the pull-up node; and a gate electrode of the seventh output control transistor is coupled to the pull-down node, a first electrode of the seventh output control transistor is coupled to the second power signal terminal, and a second electrode of the seventh output control transistor is coupled to the output terminal.

8. The shift register unit according to claim 1, wherein the output circuit includes an output transistor and a capacitor;

a gate electrode of the output transistor is coupled to the pull-up node, a first electrode of the output transistor is coupled to the second clock control circuit, and a second electrode of the output transistor is coupled to the output terminal; and one terminal of the capacitor is coupled to the pull-up node, and another terminal of the capacitor is coupled to the output terminal.

9. The shift register unit according to claim 1, wherein: duty cycles of the first clock signal, the second clock signal, the third clock signal and the fourth clock signal are all one half; and
a phase difference between the first clock signal and the second clock signal is 180 degrees, a phase difference between the third clock signal and the fourth clock signal is 180 degrees, and a phase difference between the first clock signal and the third clock signal is 90 degrees.

10. The shift register unit according to claim 5, wherein all transistors are N-type transistors.

11. A driving method of a shift register unit, with the shift register unit comprising a first clock control circuit, a second clock control circuit, an output control circuit and an output circuit, comprising:
in a first driving mode, with a first control signal output by a first control signal terminal being at a first potential and a second control signal output by a second control signal terminal being at a second potential, outputting a second clock signal from a second clock signal terminal to the output control circuit by the first clock control circuit, and outputting a first clock signal from a first clock signal terminal to the output circuit by the second clock control circuit; and
in a second driving mode, with the first control signal output by the first control signal terminal being at the second potential and the second control signal output by the second control signal terminal being at the first potential, outputting a third clock signal from a third clock signal terminal, outputting a fourth clock signal from a fourth clock signal terminal, alternately outputting the second clock signal and the first clock signal to the output control circuit by the first clock control circuit, and alternately outputting the first clock signal and the second clock signal to the output circuit by the second clock control circuit;
wherein the first clock signal, the second clock signal, the third clock signal and the fourth clock signal have a same frequency and different phases.

12. The method according to claim 11, wherein each of the first driving mode and the second driving mode includes:
an input stage, in which the input signal output from the input signal terminal is at the first potential, and the output control circuit pulls up a potential of a pull-up node to the first potential;
an output stage, in which the pull-up node maintains the first potential, and the output circuit receives and outputs a signal from the second clock control circuit; and
a reset stage, in which a reset signal output by a reset signal terminal is at the first potential, and the output control circuit controls the potential of the pull-up node to be the second potential.

13. The method according to claim 11, wherein: duty cycles of the first clock signal, the second clock signal, the third clock signal and the fourth clock signal are all one half; and
a phase difference between the first clock signal and the second clock signal is 180 degrees, a phase difference between the third clock signal and the fourth clock signal is 180 degrees, and a phase difference between the first clock signal and the third clock signal is 90 degrees.

14. A gate driver on array, comprising:
at least two cascaded shift register units, wherein each of the shift register units is the shift register unit according to claim 1.

15. A display device, comprising: the gate driver on array according to claim 14.

16. The shift register unit according to claim 2, wherein the first clock control circuit includes: a first control sub-circuit, a second control sub-circuit and a first output sub-circuit;
the first control sub-circuit is respectively coupled to the first control signal terminal, the first power signal terminal, the second power signal terminal and the first output sub-circuit, and is configured to output a first power signal from the first power signal terminal and a second power signal from the second power signal terminal to the first output sub-circuit under control of the first control signal;
the second control sub-circuit is respectively coupled to the second control signal terminal, the third clock signal terminal, the fourth clock signal terminal and the first output sub-circuit, and is configured to output the third clock signal and the fourth clock signal to the first output sub-circuit under control of the second control signal; and
the first output sub-circuit is respectively coupled to the first control sub-circuit, the second control sub-circuit, the first clock signal terminal, the second clock signal terminal and the output control circuit, and is configured to output the second clock signal to the output control circuit under control of the first power signal and the second power signal; or, the first output sub-circuit is configured to alternately output the second clock signal and the first clock signal to the output control circuit under control of the third clock signal and the fourth clock signal.

17. The shift register unit according to claim 2, wherein the second clock control circuit includes: a third control sub-circuit, a fourth control sub-circuit and a second output sub-circuit;
the third control sub-circuit is respectively coupled to the first control signal terminal, the first power signal terminal, the second power signal terminal and the second output sub-circuit, and is configured to output a first power signal from the first power signal terminal and a second power signal from the second power signal terminal to the second output sub-circuit under control of the first control signal;
the fourth control sub-circuit is respectively coupled to the second control signal terminal, the third clock signal terminal, the fourth clock signal terminal and the second output sub-circuit, and is configured to output the third clock signal and the fourth clock signal to the second output sub-circuit under control of the second control signal; and
the second output sub-circuit is respectively coupled to the third control sub-circuit, the fourth control sub-circuit, the first clock signal terminal, the second clock signal terminal and the output circuit, and is configured to output the first clock signal to the output circuit under control of the first power signal and the second power signal; or, the second output sub-circuit is configured to alternately output the first clock signal and the second clock signal to the output circuit under control of the third clock signal and the fourth clock signal.

18. The shift register unit according to claim 2, wherein the output control circuit includes a first output control transistor, a second output control transistor, a third output control transistor, a fourth output control transistor, a fifth output control transistor, a sixth output control transistor and a seventh output control transistor;

a gate electrode of the first output control transistor is coupled to the input signal terminal, a first electrode of the first output control transistor is coupled to the third power signal terminal, and a second electrode of the first output control transistor is coupled to the pull-up node;

a gate electrode of the second output control transistor is coupled to the reset signal terminal, a first electrode of the second output control transistor is coupled to the fourth power signal terminal, and a second electrode of the second output control transistor is coupled to the pull-up node;

a gate electrode of the third output control transistor is coupled to the pull-up node, a first electrode of the third output control transistor is coupled to the second power signal terminal, and a second electrode of the third output control transistor is coupled to a pull-down node;

a gate electrode of the fourth output control transistor is coupled to the output terminal, a first electrode of the fourth output control transistor is coupled to the second power signal terminal, and a second electrode of the fourth output control transistor is coupled to the pull-down node;

a gate electrode and a first electrode of the fifth output control transistor are coupled to the first clock control circuit, and a second electrode of the fifth output control transistor is coupled to the pull-down node;

a gate electrode of the sixth output control transistor is coupled to the pull-down node, a first electrode of the sixth output control transistor is coupled to the second power signal terminal, and a second electrode of the sixth output control transistor is coupled to the pull-up node; and a gate electrode of the seventh output control transistor is coupled to the pull-down node, a first electrode of the seventh output control transistor is coupled to the second power signal terminal, and a second electrode of the seventh output control transistor is coupled to the output terminal.

19. The shift register unit according to claim 2, wherein the output circuit includes an output transistor and a capacitor;

a gate electrode of the output transistor is coupled to the pull-up node, a first electrode of the output transistor is coupled to the second clock control circuit, and a second electrode of the output transistor is coupled to the output terminal; and one terminal of the capacitor is coupled to the pull-up node, and another terminal of the capacitor is coupled to the output terminal.

20. The shift register unit according to claim 2, wherein:

duty cycles of the first clock signal, the second clock signal, the third clock signal and the fourth clock signal are all one half; and a phase difference between the first clock signal and the second clock signal is 180 degrees, a phase difference between the third clock signal and the fourth clock signal is 180 degrees, and a phase difference between the first clock signal and the third clock signal is 90 degrees.

* * * * *